US012670821B2

(12) United States Patent
Ham et al.

(10) Patent No.: US 12,670,821 B2
(45) Date of Patent: Jun. 30, 2026

(54) DISPLAY DEVICE WITH STRETCHABLE WIRING

(71) Applicant: LG Display Co., Ltd., Seoul (KR)

(72) Inventors: Sujin Ham, Seoul (KR); SungJoon Min, Goyang-si (KR); HaeYoon Jung, Seoul (KR); MyungSub Lim, Seoul (KR); YuRa Jeong, Seoul (KR); Heewon Kim, Hwaseong-si (KR)

(73) Assignee: LG DISPLAY CO., LTD., Seoul (KR)

( * ) Notice: Subject to any disclaimer, the term of this patent is extended or adjusted under 35 U.S.C. 154(b) by 358 days.

(21) Appl. No.: 18/368,860

(22) Filed: Sep. 15, 2023

(65) Prior Publication Data

US 2024/0212544 A1      Jun. 27, 2024

(30) Foreign Application Priority Data

Dec. 21, 2022      (KR) ........................ 10-2022-0180534

(51) Int. Cl.
| | |
|---|---|
| *G09G 3/32* | (2016.01) |
| *G09G 3/00* | (2006.01) |
| *H10H 29/49* | (2025.01) |
| *H10W 90/00* | (2026.01) |

(52) U.S. Cl.
CPC .............. *G09G 3/035* (2020.08); *G09G 3/32* (2013.01); *H10H 29/49* (2025.01); *H10W 90/00* (2026.01); *G09G 2300/0426* (2013.01)

(58) Field of Classification Search
CPC .. G09G 3/035; G09G 3/32; G09G 2300/0426; H10H 20/857; H01L 25/0753; H01L 25/167
See application file for complete search history.

(56) References Cited

U.S. PATENT DOCUMENTS

| | | | | |
|---|---|---|---|---|
| 2020/0201393 A1* | 6/2020 | Ahn | ........................ | G09F 9/301 |
| 2020/0212117 A1* | 7/2020 | Jeon | ........................ | H10K 71/00 |

FOREIGN PATENT DOCUMENTS

| | | |
|---|---|---|
| KR | 10-2020-0078176 A | 7/2020 |
| KR | 10-2022-0059284 A | 5/2022 |

* cited by examiner

*Primary Examiner* — Afroza Chowdhury
(74) *Attorney, Agent, or Firm* — Birch, Stewart, Kolasch & Birch, LLP

(57) ABSTRACT

A display device includes a lower substrate which is stretchable and is divided into a first area, a second area, and a third area; a plurality of lower conductive patterns disposed on the first area of the lower substrate; a plurality of pixels which is disposed on the second area of the lower substrate; a plurality of lower connection lines which is disposed on the third area of the lower substrate and is connected to at least one the plurality of pixels; an upper substrate which is opposite to the lower substrate and is stretchable; and a plurality of upper conductive patterns which is disposed below the upper substrate and is overlapped with the plurality of lower conductive patterns. By doing this, the excessive stretching of the display device can be suppressed or controlled.

13 Claims, 7 Drawing Sheets

DISPLAY DEVICE WITH STRETCHABLE WIRING

CROSS-REFERENCE TO RELATED APPLICATIONS

This application claims priority to Korean Patent Application No. 10-2022-0180534 filed on Dec. 21, 2022 in the Republic of Korea, the entire disclosure of which is hereby expressly incorporated by reference into the present application.

BACKGROUND

Field

The present disclosure relates to a stretchable display device.

Discussion of the Related Art

Among display devices used in a monitor of a computer, a television, or a cellular phone, there exist an organic light emitting display (OLED) device which is a self-emitting device and a liquid crystal display (LCD) device which requires a separate light source.

An applicable range of the display device can be diversified and expanded to personal digital assistants as well as monitors of computers and televisions. As such, a display device with a large display area and a reduced volume and weight is being studied.

A display device can be manufactured by forming a display unit and a wiring line on a flexible substrate such as plastic. This allows the display device to be stretchable in a specific direction and changed in various forms, which is getting attention as a next generation display device.

SUMMARY OF THE DISCLOSURE

An object to be achieved by the present disclosure is to provide a display device which suppresses excessive stretching.

Another object to be achieved by the present disclosure is to provide a display device which is capable of reducing a number of connection lines of the lower substrate.

Objects of the present disclosure are not limited to the above-mentioned objects, and other objects, which are not mentioned above, can be clearly understood by those skilled in the art from the following descriptions.

According to an aspect of the present disclosure, a display device includes a lower substrate which is stretchable and is divided into a first area, a second area, and a third area; a plurality of lower conductive patterns disposed on the first area of the lower substrate; a plurality of pixels disposed on the second area of the lower substrate; a plurality of lower connection lines disposed on the third area of the lower substrate and connected to each of the plurality of pixels; an upper substrate disposed opposite to the lower substrate and configured to be stretchable; and a plurality of upper conductive patterns disposed below the upper substrate and overlapped with the plurality of lower conductive patterns. By doing this, the excessive stretching of the display device can be suppressed.

Other detailed matters of the exemplary embodiments are included in the detailed description and the drawings.

According to the present disclosure, when a light emitting diode is excessively stretched beyond an allowable range, the light emitting diode can erroneously operate. Therefore, the excessive-stretching is recognized to the user so that the user does not excessively stretch the display device to ensure the reliability of the repeated stretching of the display device.

A number of connection lines on the lower substrate is reduced so that a stretching rate of the display device can be improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
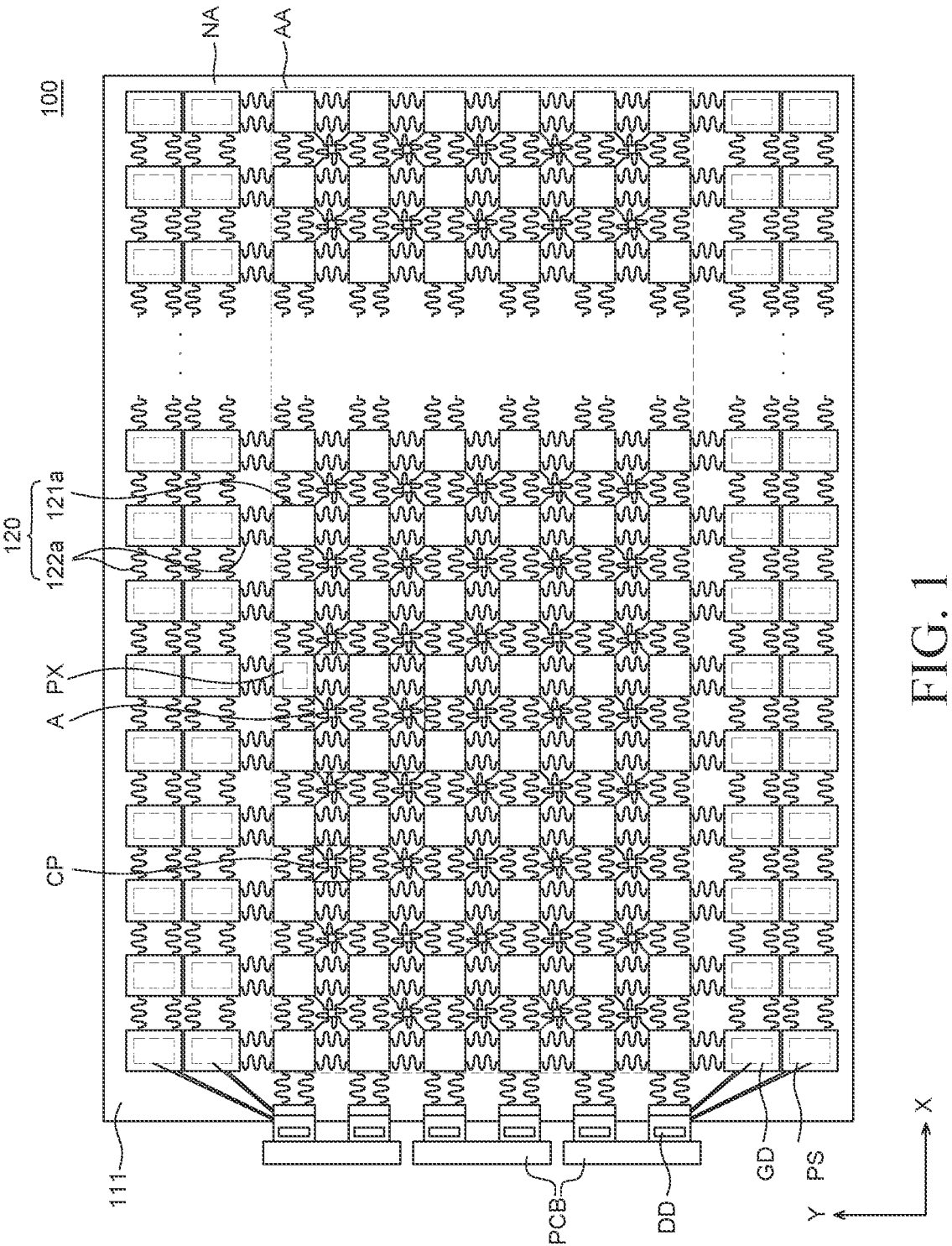
FIG. 1 is a plan view illustrating a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," etc. used herein are generally intended to allow other components to be added unless the terms are used with the term "only". Any references to singular can include plural unless expressly stated otherwise. Further, the term "exemplary" is hereby used interchangeably with the term "example" and can have the same or similar meaning as that term.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order or sequence. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of each display device according to all embodiments of the present disclosure are operatively coupled and configured.

A display device according to an exemplary embodiment of the present disclosure is a display device which is capable of displaying images even in a bent or extended state and is also referred to as a stretchable display device, a flexible display device and an extendable display device. As compared with the general display devices of the related art, the display device has not only a high flexibility, but also stretchability. Therefore, the user can bend or extend a display device and a shape of a display device can be freely changed in accordance with manipulation of a user. For example, when the user pulls the display device by holding ends of the display device, the display device can be extended to the pulling direction of the user. Alternatively, when the user disposes the display device on an outer surface which is not flat, the display device can be disposed to be bent in accordance with the shape of the outer surface of the wall. Further, when a force applied by the user is removed, the display device can return to its original shape.

<Stretchable Substrate and Pattern Layer>

FIG. 1 is a plan view illustrating a display device according to an exemplary embodiment of the present disclosure.

Figure 2:
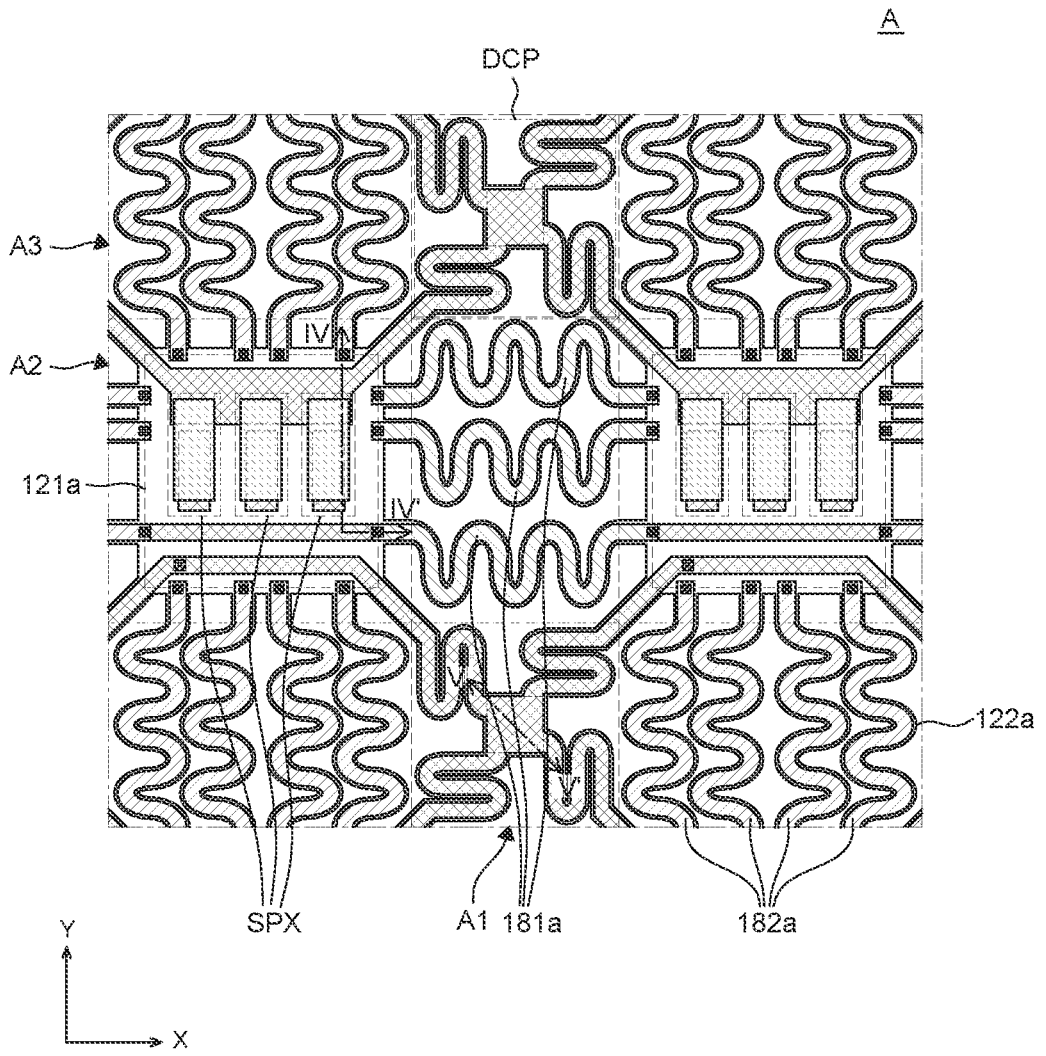
FIG. 2 is an enlarged plan view of a lower substrate of a display device according to an exemplary embodiment of the present disclosure.

FIG. 2 is an enlarged plan view of a lower substrate of a display device according to an exemplary embodiment of the present disclosure.

Figure 3:
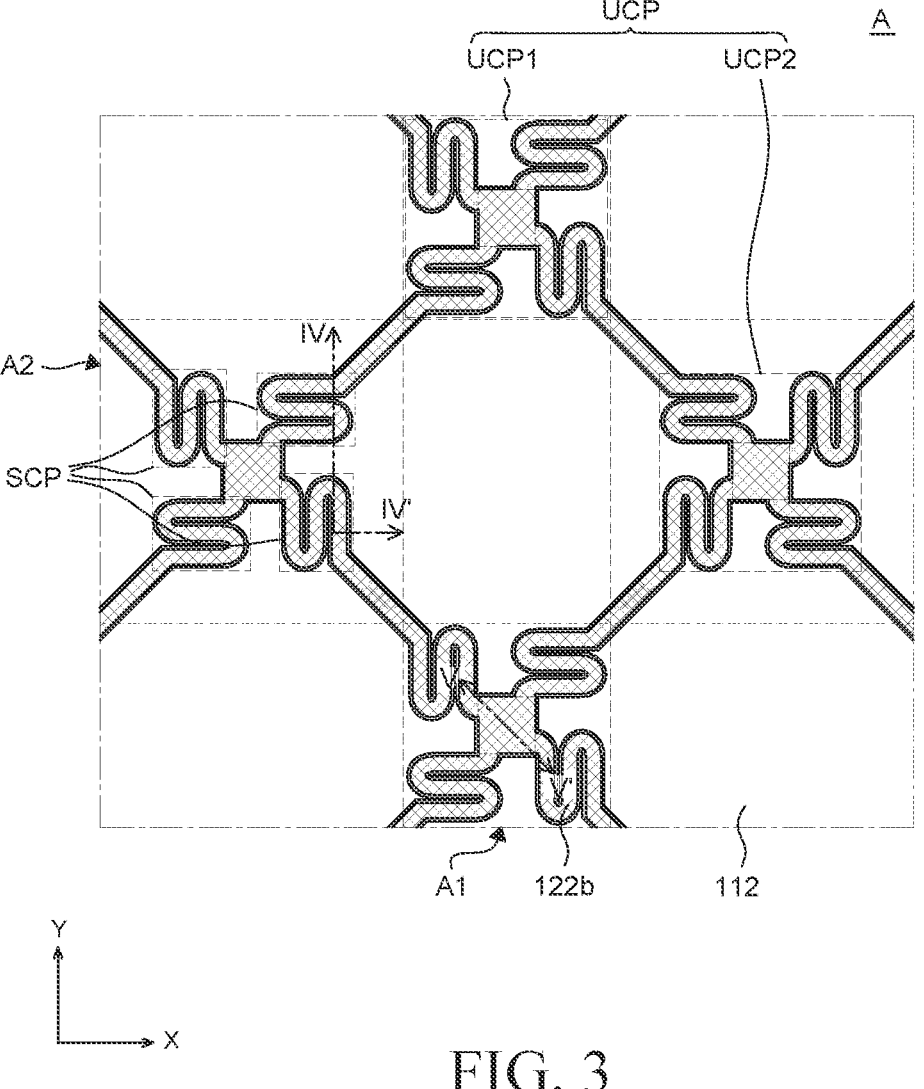
FIG. 3 is an enlarged plan view of an upper substrate of a display device according to an exemplary embodiment of the present disclosure.

FIG. 3 is an enlarged plan view of an upper substrate of a display device according to an exemplary embodiment of the present disclosure.

Figure 4A:
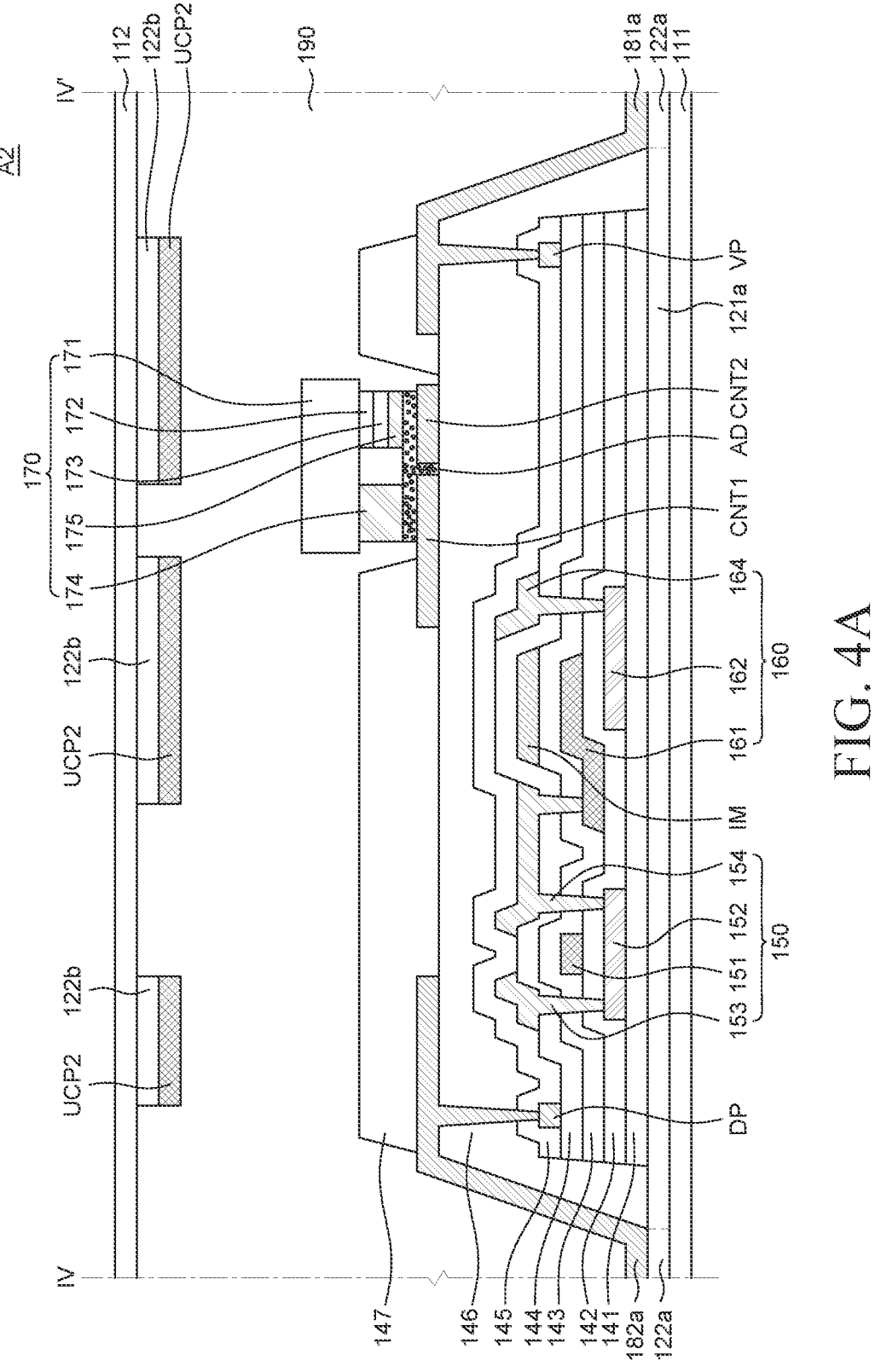
FIGS. 4A and 4B are cross-sectional views taken along the line IV-IV' of FIGS. 2 and 3 in different states.
Figure 4B:
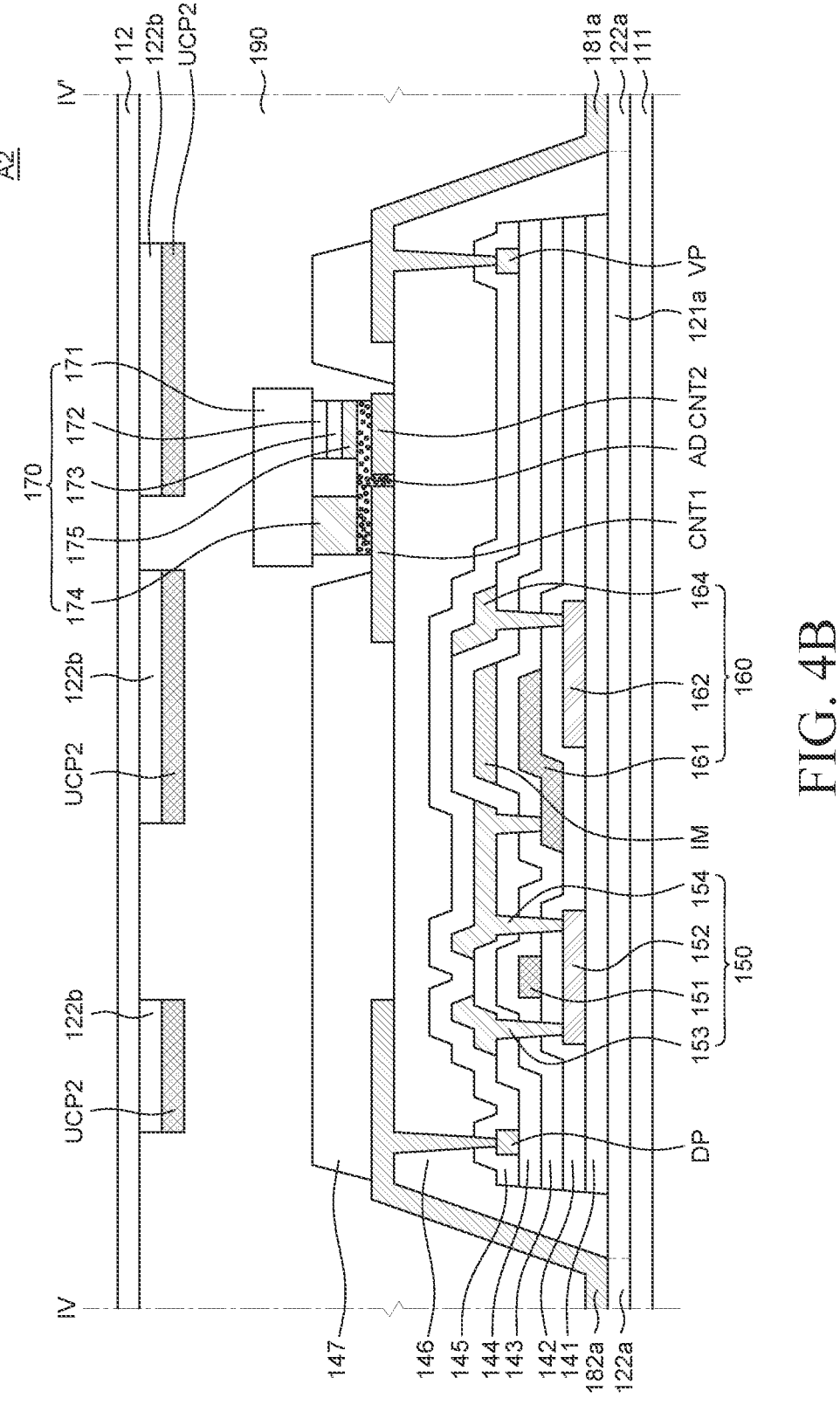

FIGS. 4A and 4B are cross-sectional views taken along the line IV-IV' of FIGS. 2 and 3.

Figure 5A:
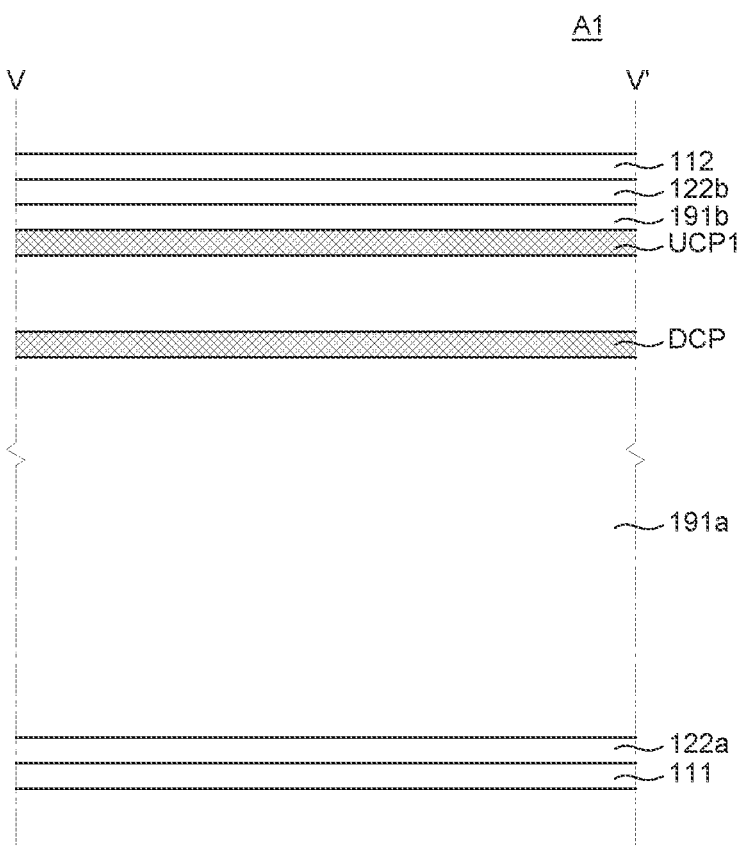
FIGS. 5A and 5B are cross-sectional views taken along the line V-V' of FIGS. 2 and 3 in different states.
Figure 5B:
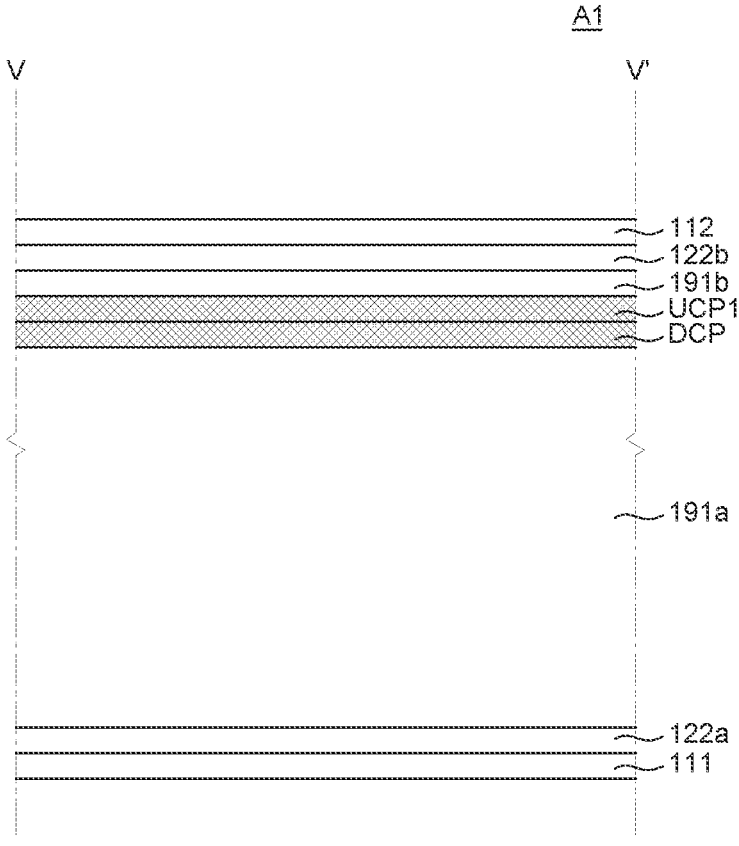

FIGS. 5A and 5B are cross-sectional views taken along the line V-V' of FIGS. 2 and 3.

Specifically, FIGS. 4A and 5A are cross-sectional views when the display device is not stretched and FIGS. 4B and 5B are cross-sectional views when the display device is excessively stretched.

For the convenience of description, FIG. 1 illustrates components of a display device 100, other than an upper substrate 112 of the display device. Further, in FIG. 2, a lower substrate 111 and components disposed on the lower substrate 111 in an area A illustrated in FIG. 1 are illustrated. Further, in FIG. 3, the upper substrate 112 and components disposed on the upper substrate 112 in an area A illustrated in FIG. 1 are illustrated.

Referring to FIG. 1, the display device 100 according to an exemplary embodiment of the present disclosure includes the lower substrate 111, a pattern layer 120, a plurality of conductive patterns CP, a plurality of pixels PX, a gate driver GD, a data driver DD, and a power supply PS. In the exemplary embodiment, further referring to FIGS. 4A and 5A, the display device 100 can further include a filling layer 190 and the upper substrate 112.

The lower substrate 111 is a substrate which supports and protects several components of the display device 100. The upper substrate 112 is a substrate which covers and protects several components of the display device 100. For example, the lower substrate 111 is a substrate which supports the pattern layer 120 on which the pixels PX, the plurality of conductive patterns CP, the gate driver GD, and the power supply PS are formed. The upper substrate 112 is a substrate which covers the pixels PX, the gate driver GD, and the power supply PS.

The lower substrate 111 and the upper substrate 112 which are flexible substrates can be configured by an insulating material which is bendable or extendable. For example, the lower substrate 111 and the upper substrate 112 can be formed of a silicon rubber, such as polydimethylsiloxane (PDMS) or an elastomer such as polyurethane (PU) or polytetrafluoroethylene (PTFE). Accordingly, the lower substrate 111 and the upper substrate 112 can have flexibility. Depending on the exemplary embodiment, the materials of the lower substrate 111 and the upper substrate 112 can be the same, but are not limited thereto and can vary.

The lower substrate 111 and the upper substrate 112 are flexible substrates so as to be reversibly expandable and contractible. Accordingly, the lower substrate 111 can be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate.

The upper substrate 112 can be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate.

Further, moduli of elasticity of the lower substrate 111 and the upper substrate 112 can be several MPa to several hundreds of MPa. Further, a ductile breaking rate of the lower substrate 111 and the upper substrate 112 can be 100% or higher. Here, the ductile breaking rate refers to a stretching rate at a timing when an object to be stretched is broken or cracked. Further, the thickness of the lower substrate 111 can be 10 um to 1 mm, but is not limited thereto.

The lower substrate 111 can include an active area AA and a non-active area NA which encloses the active area AA. However, the active area AA and the non-active area NA are not mentioned to be limited to the lower substrate 111, but mentioned for the entire display device 100.

The active area AA is an area in which images are displayed in the display device 100. A plurality of pixels PX can be disposed on the active area AA. Each pixel PX can include a display element and various driving elements for driving the display element. Various driving elements can refer to at least one thin film transistor (TFT) and a capacitor, but are not limited thereto. The plurality of pixels PX can be connected to various wiring lines, respectively. For example, each of the plurality of pixels PX can be connected to various wiring lines, such as a gate line, a data line, a high potential voltage line, a low potential voltage line, a reference voltage line, and an initialization voltage line.

In the active area AA, the plurality of conductive patterns can be disposed to determine whether the display device 100 is stretched excessively (e.g., beyond an allowable range or to a set parameter). The plurality of conductive patterns can be disposed between the plurality of pixels or disposed so as to overlap the plurality of pixels.

The non-active area NA is an area where no image is displayed. The non-active area NA is disposed to be adjacent to the active area AA. For example, the non-active area NA is an area which encloses the active area AA. However, it is not limited thereto so that the non-active area NA corresponds to an area excluding the active area AA from the lower substrate 111 and can be modified and separated in various forms. Components for driving a plurality of pixels PX disposed in the active area AA can be disposed on the non-active area NA. For example, the gate driver GD and the power supply PS can be disposed on the non-active area NA. Further, on the non-active area NA, a plurality of pads connected to the gate driver GD and the data driver DD can be disposed and each pad can be connected to each of the plurality of pixels PX of the active area AA.

The pattern layer 120 can be disposed between the lower substrate 111 and the upper substrate 112. Specifically, as illustrated in FIGS. 4A and 4B, the pattern layer 120 includes lower pattern layers 121a and 122a and an upper pattern layer 122b. The lower pattern layers 121a and 122a are pattern layers which are disposed on the lower substrate 111 to be in contact with the lower substrate 111. The upper pattern layer 122b is a pattern layer which is disposed on the upper substrate 112 to be in contact with the upper substrate 112.

Specifically, as illustrated in FIG. 2, the lower pattern layers 121a and 122a include a plurality of lower plate patterns 121a which is disposed as islands which are spaced apart from each other and a plurality of lower line patterns 122a which connects the plurality of lower plate patterns 121a. As illustrated in FIG. 3, the upper pattern layer 122b is configured by an upper line pattern 122b having a shape corresponding to a shape of an upper conductive pattern UCP having a bonded line shape.

However, the upper pattern layer is not limited thereto and includes a plurality of upper plate patterns which is disposed as islands which are spaced apart from each other and a plurality of upper line patterns which connects the plurality of upper plate patterns.

Referring to FIGS. 1, 2, and 4A and 4B, a plurality of pixels PX can be formed on the plurality of lower plate patterns 121a disposed in the active area AA. Further, the gate driver GD and the power supply PS can be disposed on the plurality of lower plate patterns 121a disposed in the non-active area NA.

The plurality of lower plate patterns 121a can be individually separated. Accordingly, the plurality of lower plate patterns 121a is also referred to as a plurality of bottom island patterns or bottom individual patterns.

In one exemplary embodiment, the gate driver GD can be mounted on the plurality of lower plate patterns 121a disposed in the non-active area NA. Various circuit configurations which configure the gate driver GD, such as various transistors, capacitors, and wiring lines, can be disposed on the plurality of lower plate patterns 121a disposed in the non-active area NA. However, this is illustrative, so that the exemplary embodiment of the present disclosure is not limited thereto, and the gate driver GD can be mounted on the plurality of lower plate patterns 123 disposed in the non-active area NA in a chip on film (COF) manner.

In one exemplary embodiment, the power supply PS can be mounted on the plurality of lower plate patterns 121a disposed in the non-active area NA. Power blocks which are disposed on different layers are disposed on the plurality of lower plate patterns 121a disposed in the non-active area NA. A lower power block and an upper power block are sequentially disposed on the plurality of lower plate patterns 121a disposed in the non-active area NA. For example, a low potential voltage can be applied to the lower power block and a high potential voltage can be applied to the upper power block. Accordingly, a low potential voltage is supplied to the plurality of pixels PX through a lower power block and a high potential voltage is supplied to the plurality of pixels PX through an upper power block.

According to the exemplary embodiment, as illustrated in FIG. 1, sizes of the plurality of lower plate patterns 121a disposed in the non-active area NA can be larger than sizes of the plurality of lower plate patterns 121a disposed in the active area AA. To be more specific, an area occupied by various circuit configurations which configure one stage of the gate driver GD is relatively larger than an area occupied by the pixels PX. Therefore, a size of the plurality of lower plate patterns 121a disposed in the non-active area NA can be larger than a size of the plurality of lower plate patterns 121a disposed in the active area AA.

Even though in FIG. 1, it is illustrated that the plurality of lower plate patterns 121a disposed in the plurality of non-active areas NA are disposed on both sides of a second direction Y in the non-active area NA, this is illustrative, but the exemplary embodiment of the present disclosure is not limited thereto. For example, the plurality of lower plate patterns 121a disposed in the non-active area can be disposed in an arbitrary area of the non-active area NA. Further, even though in FIGS. 1 and 2, the plurality of lower plate patterns 121a has a quadrangular shape, this is illustrative, and the exemplary embodiment of the present disclosure is not limited thereto and the plurality of lower plate patterns 121a can be modified in various forms.

In the meantime, the plurality of lower line patterns 122a is patterns which connect adjacent lower plate patterns 121a and are referred to as lower connection patterns. For example, the plurality of lower line patterns 122a can be disposed between the plurality of lower plate patterns 121a.

In one exemplary embodiment, referring to FIG. 1, the plurality of upper line patterns 122b and the plurality of lower line patterns 122a can have a wavy shape. For example, the plurality of upper line patterns 122b and the plurality of lower line patterns 122a have a sinusoidal shape. However, this is just illustrative and the shapes of the plurality of upper line patterns 122b and the plurality of lower line patterns 122a are not limited thereto. For example, the plurality of upper line patterns 122b and the plurality of lower line patterns 122a have a zigzag shape. As another example, the plurality of upper line patterns 122b and the plurality of lower line patterns 122a can have various shapes such as a plurality of rhombic substrates which is connected at their vertexes to be extended. As described above, a number and a shape of the plurality of upper line patterns 122b and the plurality of lower line patterns 122a illustrated in FIG. 1 are illustrative and the number and the shape of the plurality of upper line patterns 122b and the plurality of lower line patterns 122a can vary depending on the design.

In one exemplary embodiment, the plurality of lower plate patterns 121a, the plurality of upper line patterns 122b, and the plurality of lower line patterns 122a are rigid patterns. For example, the plurality of lower plate patterns 121a, the plurality of upper line patterns 122b, and the plurality of lower line patterns 122a are more rigid than the lower substrate 111 and the upper substrate 112. Accordingly, moduli of elasticity of the plurality of lower plate patterns 121a, the plurality of upper line patterns 122b, and the plurality of lower line patterns 122a are higher than a modulus of elasticity of the lower substrate 111 and the upper substrate 112. The modulus of elasticity is a parameter representing a rate of deformation against the stress applied to the substrate and the higher the modulus of elasticity, the higher the hardness. Moduli of elasticity of the plurality of lower plate patterns 121a, the plurality of upper line patterns 122b, and the plurality of lower line patterns 122a can be 1000 times higher than the moduli of elasticity of the lower substrate 111 and the upper substrate 112. However, this is illustrative, and the exemplary embodiment of the present disclosure is not limited thereto.

In one exemplary embodiment, each of the plurality of lower plate patterns 121a, the plurality of upper line patterns 122b, and the plurality of lower line patterns 122a can include a plastic material having a lower flexibility than the lower substrate 111 and the upper substrate 112. For example, the plurality of lower plate patterns 121a, the plurality of upper line patterns 122b, and the plurality of lower line patterns 122a include at least one material of polyimide (PI), polyacrylate, and polyacetate. According to an exemplary embodiment, the plurality of lower plate patterns 121a, the plurality of upper line patterns 122b, and the plurality of lower line patterns 122a can be formed of the same material, but is not limited thereto and can be formed of different materials. When the plurality of lower plate patterns 121a, the plurality of upper line patterns 122b, and the plurality of lower line patterns 122a are formed of the same material, the plurality of upper plate patterns 121b and the plurality of upper line patterns 122b are integrally formed. Further, the plurality of lower plate patterns 121a and the plurality of lower line patterns 122a can be integrally formed.

In some exemplary embodiments, the lower substrate 111 can be defined to include a plurality of first lower patterns and a second lower pattern. The plurality of first lower patterns can be an area of the lower substrate 111 overlapping the plurality of lower plate patterns 121a and the second lower pattern can be an area which does not overlap the plurality of lower plate patterns 121a.

Further, the upper substrate 112 is defined to include a plurality of first upper patterns and a second upper pattern. The plurality of first upper patterns can be an area of the upper substrate 112 overlapping the plurality of upper line patterns 122b and the second upper pattern can be an area which does not overlap the plurality of upper line patterns 122b.

At this time, moduli of elasticity of the plurality of first lower patterns and the first upper pattern can be higher than moduli of elasticity of the second lower pattern and the second upper pattern. For example, the plurality of first lower patterns and the first upper pattern are formed of the same material as the plurality of lower plate patterns 121a and the second lower pattern and the second upper pattern can be formed of a material having a modulus of elasticity lower than the plurality of lower plate patterns 121a.

For example, the first lower pattern and the first upper pattern can be formed of polyimide (PI), polyacrylate, or polyacetate. Further, the second lower pattern and the second upper pattern can be formed of silicon rubber such as polydimethylsiloxane (PDMS) or elastomer such as polyurethane (PU) or polytetrafluoroethylene.

<Driving Element of Non-Active Area>

The gate driver GD supplies a gate voltage to the plurality of pixels PX disposed in the active area AA. The gate driver GD includes a plurality of stages formed on the plurality of lower plate patterns 121a disposed in the non-active area NA and each stage included in the gate driver GD can be electrically connected to each other by means of the plurality of gate connection lines. Accordingly, a gate voltage output from any one of stages can be transmitted to the other stage. Each stage can sequentially supply the gate voltage to the plurality of pixels PX connected to each stage.

The power supply PS is connected to the gate driver GD to supply a gate driving voltage and a gate clock voltage to the gate driver GD. The power supply PS is connected to the plurality of pixels PX to supply a pixel driving voltage to each of the plurality of pixels PX. Further, the power supply PS can be formed on the plurality of lower plate patterns 121a disposed in the non-active area NA. For example, the power supply PS can be formed on the plurality of lower plate patterns 121a disposed in the non-active area NA to be adjacent to the gate driver GD. A plurality of power supplies PS formed on the plurality of lower plate patterns 121a disposed in the non-active area NA is electrically connected to the gate driver GD and the plurality of pixels PX. For example, the plurality of power supplies PS formed on the plurality of lower plate patterns 121a disposed in the non-active area NA can be connected to the gate driver GD and the plurality of pixels PX by a gate power supply connection line and a pixel power supply connection line. Therefore, each of the plurality of power supplies PS supplies a gate driving voltage, a gate clock voltage, and a pixel driving voltage.

The printed circuit board PCB transmits signals and voltages for driving the display element from the control unit to the display element. Therefore, the printed circuit board PCB can also be referred to as a driving substrate. A control unit, such as an IC chip or a circuit unit, can be mounted on the printed circuit board PCB. Further, on the printed circuit board PCB, a memory or a processor can also be mounted. The printed circuit board PCB provided in the display device 100 can include a stretching area and a non-stretching area to ensure stretchability. In the non-stretching area, an IC chip, a circuit unit, a memory, and a processor are mounted and in the stretching area, wiring lines which are electrically connected to the IC chip, the circuit unit, the memory, and the processor can be disposed.

The data driver DD supplies a data voltage to the plurality of pixels PX disposed in the active area AA. The data driver DD is configured as an IC chip so that it is also referred to as a data integrated circuit D-IC. The data driver DD can be mounted in the non-stretching area of the printed circuit board PCB. For example, the data driver DD can be mounted on the printed circuit board PCB in the form of a chip on board (COB). Even though in FIG. 1, it is illustrated that the data driver DD is mounted in a chip on film (COF) manner, it is not limited thereto, and the data driver DD can be mounted by a chip on board (COB), a chip on glass (COG), or a tape carrier package (TCP) manner.

Further, even though in FIG. 1, one data driver DD is disposed so as to correspond to one line of the lower plate patterns 121a disposed in the active area AA, it is not limited thereto. For example, one data driver DD can be disposed so as to correspond to a plurality of lines of lower plate patterns 121*a*.

In the meantime, referring to FIG. 2, the active area of the display device 100 according to the exemplary embodiment of the present disclosure is divided into a first area A1 in which the plurality of lower conductive patterns DCP is disposed, a second area A2 in which the plurality of pixels PX is disposed, and a third area A3 in which the plurality of lower connection lines 181*a* and 182*a* is disposed. In other words, the lower substrate 111 is divided into a first area A1 in which the plurality of lower conductive patterns DCP is disposed, a second area A2 in which the plurality of pixels PX is disposed, and a third area A3 in which the plurality of lower connection lines 181*a* and 182*a* is disposed.

<Planar and Cross-Sectional Structures>

Referring to FIGS. 2, 4A and 4B, a pixel PX including the plurality of sub pixels SPX is disposed in the lower plate pattern 121*a* disposed on the lower substrate 111. Each of the plurality of sub pixels SPX can include a light emitting diode 170 which is a display element and a driving transistor 160 and a switching transistor 150 which drive the light emitting diode 170. However, in the sub pixel SPX, the light emitting diode is not limited to an LED, and can also be changed to an organic light emitting diode. For example, the plurality of sub pixels SPX can include a red sub pixel, a green sub pixel, and a blue sub pixel, but is not limited thereto and colors of the plurality of sub pixels SPX can be modified to various colors as needed.

The plurality of sub pixels SPX can be connected to the plurality of lower connection lines 181*a* and 182*a*. For example, the plurality of sub pixels SPX is electrically connected to the first lower connection line 181*a* extending in the first direction X and the plurality of sub pixels SPX is electrically connected to the second lower connection line 182*a* extending in the second direction Y.

Referring to FIGS. 2, 3, 4A, and 4B, a first upper conductive pattern UCP1 is disposed in the upper line pattern 121*b* disposed on the upper substrate 112. The first upper conductive pattern UCP1 can overlap each of the plurality of pixels PX.

In the meantime, referring to FIGS. 4A and 4B, a plurality of inorganic insulating layers is disposed on the plurality of lower plate patterns 121*a*. For example, a plurality of inorganic insulating layers can include a buffer layer 141, a gate insulating layer 142, a first interlayer insulating layer 143, a second interlayer insulating layer 144, and a passivation layer 145. However, the exemplary embodiment of the present disclosure is not limited thereto, and various inorganic insulating layers are additionally disposed on the plurality of lower plate patterns 121*a*. At least one of the buffer layer 141, the gate insulating layer 142, the first interlayer insulating layer 143, the second interlayer insulating layer 144, and the passivation layer 145 which are inorganic insulating layers can be omitted.

To be more specific, the buffer layer 141 is disposed on the plurality of lower plate patterns 121*a*. The buffer layer 141 is formed on the plurality of lower plate patterns 121*a* to protect various components of the display device 100 from permeation of moisture ($H_2O$) and oxygen ($O_2$) from the outside of the lower substrate 111 and the plurality of lower plate patterns 121*a*. The buffer layer 141 can be configured by an insulating material. For example, the buffer layer 141 can be configured by a single layer or a double layer formed of at least one of silicon nitride (SiNx), silicon oxide (SiOx), and silicon oxynitride (SiON). However, the buffer layer 141 can be omitted depending on a structure or a characteristic of the display device 100.

Here, the buffer layer 141 can be formed only in an area where the lower substrate 111 is overlapped with the plurality of lower plate patterns 121*a*. As described above, the buffer layer 141 can be formed of an inorganic material so that the buffer layer 141 can be easily cracked or damaged during a process of stretching the display device 100. Therefore, the buffer layer 141 is not formed in an area between the plurality of lower plate patterns 121*a*, but is patterned to have a shape of the plurality of lower plate patterns 121*a* to be formed only above the plurality of lower plate patterns 121*a*. Therefore, in the display device 100 according to the exemplary embodiment of the present disclosure, the buffer layer 141 is formed only in an area overlapping the plurality of lower plate patterns 121*a* which are rigid patterns. Therefore, even though the display device 100 is bent or extended to be deformed, the damage of various components of the display device 100 can be suppressed.

A switching transistor 150 including a gate electrode 151, an active layer 152, a source electrode 153, and a drain electrode 154 and a driving transistor 160 including a gate electrode 161, an active layer 162, a source electrode and a drain electrode 164 are formed on the buffer layer 141.

First, the active layer 152 of the switching transistor 150 and the active layer 162 of the driving transistor 160 are disposed on the buffer layer 141. For example, the active layer 152 of the switching transistor 150 and the active layer 162 of the driving transistor 160 can be formed of oxide semiconductors. Alternatively, the active layer 152 of the switching transistor 150 and the active layer 162 of the driving transistor 160 can be formed of amorphous silicon (a-Si), polycrystalline silicon (poly-Si), or an organic semiconductor.

The gate insulating layer 142 is disposed on the active layer 152 of the switching transistor 150 and the active layer 162 of the driving transistor 160. The gate insulating layer 142 electrically insulates the gate electrode 151 of the switching transistor 150 from the active layer 152 of the switching transistor 150 and electrically insulates the gate electrode 161 of the driving transistor 160 from the active layer 162 of the driving transistor 160. The gate insulating layer 142 can include an insulating material. For example, the gate insulating layer 142 can be configured by a single layer of silicon nitride (SiNx) or silicon oxide (SiOx) which is an inorganic material or a multiple layer of silicon nitride (SiNx) or silicon oxide (SiOx), but it is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed on the gate insulating layer 142 to be spaced apart from each other. The gate electrode 151 of the switching transistor 150 overlaps the active layer 152 of the switching transistor 150 and the gate electrode 161 of the driving transistor 160 overlaps the active layer 162 of the driving transistor 160.

The gate electrode 151 of the switching transistor 150 and the gate electrode 161 of the driving transistor 160 can be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The first interlayer insulting layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 can be formed of an inorganic material, similarly to the buffer layer 141. For example, the first interlayer insulating layer 143 can be configured by a single layer of silicon nitride (SiNx) or silicon oxide (SiOx) which is an inorganic material or a multiple layer of silicon nitride (SiNx) or silicon oxide (SiOx), but it is not limited thereto.

The intermediate metal layer IM is disposed on the first interlayer insulating layer 143. The intermediate metal layer IM overlaps the gate electrode 161 of the driving transistor 160. Therefore, a capacitor (for example, a storage capacitor) is formed in an overlapping area of the intermediate metal layer IM and the gate electrode 161 of the driving transistor 160. Specifically, the storage capacitor can be formed by the gate electrode 161 of the driving transistor 160, the first interlayer insulating layer 143, and the intermediate metal layer IM. However, the placement area of the intermediate metal layer IM is not limited thereto, and the intermediate metal layer IM overlaps the other electrode to form the storage capacitor in various forms.

The intermediate metal layer IM can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. The second interlayer insulating layer 144 insulates the intermediate metal layer IM from the source electrode and the drain electrode 164 of the driving transistor 160. The second interlayer insulating layer 144 can be formed of an inorganic material, which is the same as the buffer layer 141. For example, the second interlayer insulating layer 144 can be configured by a single layer of silicon nitride (SiNx) or silicon oxide (SiOx) which is an inorganic material or a multiple layer of silicon nitride (SiNx) or silicon oxide (SiOx), but it is not limited thereto.

The source electrode 153 and the drain electrode 154 of the switching transistor 150 are disposed on the second interlayer insulating layer 144. The source electrode and the drain electrode 164 of the driving transistor 160 are disposed on the second interlayer insulating layer 144. The source electrode 153 and the drain electrode 154 of the switching transistor 150 are disposed on the same layer to be spaced apart from each other. Even though in FIG. 1, the source electrode of the driving transistor 160 is omitted, the source electrode of the driving transistor 160 is also disposed on the same layer to be spaced apart from the drain electrode 164. In the switching transistor 150, the source electrode 153 and the drain electrode 154 can be in contact with the active layer 152 to be electrically connected to the active layer 152. In the driving transistor 160, the source electrode and the drain electrode 164 can be in contact with the active layer 162 to be electrically connected to the active layer 162. The drain electrode 154 of the switching transistor 150 is in contact with the gate electrode 161 of the driving transistor 160 through a contact hole to be electrically connected to the gate electrode 161 of the driving transistor 160.

The source electrode 153 and the drain electrodes 154 and 164 can include any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

Further, in this specification, even though it is described that the driving transistor 160 has a coplanar structure, various transistors such as a staggered structure can also be used. Further, in this specification, the transistor can be formed not only to have a top gate structure, but also to have a bottom gate structure.

A gate pad and a data pad DP can be disposed on the second interlayer insulating layer 144.

Specifically, the gate pad is a pad which transmits a gate voltage to the plurality of sub pixels SPX. The gate pad is connected to the first lower connection line 181*a* through a contact hole. Further, the gate voltage supplied from the first lower connection line 181*a* can be transmitted to the gate electrode 151 of the switching transistor 150 from the gate pad through a wiring line formed on the lower plate pattern 121*a*.

The data pad DP can be a pad which transmits a data voltage to the plurality of sub pixels SPX. The data pad DP is connected to the second lower connection line 182*a* through a contact hole. Further, the data voltage supplied from the second lower connection line 182*a* can be transmitted to the source electrode 153 of the switching transistor 150 from the data pad DP through a wiring line formed on the lower plate pattern 121*a*.

A voltage pad VP is a pad which transmits a high potential voltage to the plurality of sub pixels SPX. The voltage pad VP is connected to the first lower connection line 181*a* through a contact hole. Further, a high potential voltage supplied from the first lower connection line 181*a* can be transmitted to the driving transistor 160 from the voltage pad VP through a wiring line formed on the lower plate pattern 121*a*. The above-described high potential voltage is referred to as a second driving voltage and a low potential voltage to be described below can be referred to as a first driving voltage.

The gate pad, the data pad DP, and the voltage pad VP can be formed of the same material as the source electrode 153 and the drain electrodes 154 and 164, but are not limited thereto.

The passivation layer 145 can be formed on the switching transistor 150 and the driving transistor 160. For example, the passivation layer 145 covers the switching transistor 150 and the driving transistor 160 to protect the switching transistor 150 and the driving transistor 160 from the permeation of moisture and oxygen. The passivation layer 145 can be formed of an inorganic material and configured by a single layer or a double layer, but is not limited thereto.

The gate insulating layer 142, the first interlayer insulating layer 143, the second interlayer insulating layer 144, and the passivation layer 145 are patterned to be formed only in an area overlapping the plurality of lower plate patterns 121*a*. The gate insulating layer 142, the first interlayer insulating layer 143, the second interlayer insulting layer 144, and the passivation layer 145 are also formed of the inorganic material, similar to the buffer layer 141. Therefore, the gate insulating layer 142, the first interlayer insulating layer 143, the second interlayer insulating layer 144, and the passivation layer 145 can also be easily cracked to be damaged during the process of stretching the display device 100. Therefore, the gate insulating layer 142, the first interlayer insulating layer 143, the second interlayer insulating layer 144, and the passivation layer 145 are not formed in an area between the plurality of lower plate patterns 121*a*, but are patterned to have a shape of the plurality of lower plate patterns 121*a* to be formed only above the plurality of lower plate patterns 121*a*.

The planarization layer 146 is formed on the passivation layer 145. The planarization layer 146 planarizes upper portions of the switching transistor 150 and the driving transistor 160. The planarization layer 146 can be configured by a single layer or a plurality of layers and can be formed of an organic material. Therefore, the additional planarization layer 146 can also be referred to as an organic insulating layer. For example, the planarization layer 146 can be formed of an acrylic organic material, but is not limited thereto.

Referring to FIGS. 4A and 4B, the planarization layer 146 can be disposed so as to cover top surfaces and side surfaces of the buffer layer 141, the gate insulating layer 142, the first interlayer insulating layer 143, the second interlayer insulating layer 144, and the passivation layer 145 on the plurality of lower plate patterns 121*a*. Further, the planarization layer 146 encloses the buffer layer 141, the gate insulating layer 142, the first interlayer insulating layer 143, the second interlayer insulating layer 144, and the passivation layer 145 together with the plurality of lower plate patterns 121*a*. To be more specific, the planarization layer 146 can be disposed so as to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of lower plate patterns 121*a*. Accordingly, the planarization layer 146 can supplement a step on side surfaces of the buffer layer 141, the gate insulating layer 142, the first interlayer insulating layer 143, the second interlayer insulating layer 144, and the passivation layer 145. Further, the planarization layer 146 can enhance an adhesive strength with the lower connection lines 181*a* and 182*a* disposed on a side surface of the planarization layer 146.

Referring to FIGS. 4A and 4B, an inclination angle of the side surface of the planarization layer 146 can be smaller than an inclination angle formed by side surfaces of the buffer layer 141, the gate insulating layer 142, the first interlayer insulating layer 143, the second interlayer insulating layer 144, and the passivation layer 145. For example, the side surface of the planarization layer 146 can have a slope which is gentler than a slope formed by the side surface of the passivation layer 145, the side surface of the first interlayer insulating layer 143, the side surface of the second interlayer insulating layer 144, the side surface of the gate insulating layer 142, and the side surface of the buffer layer 141. Therefore, the lower connection lines 181*a* and 182*a* which are disposed to be in contact with the side surface of the planarization layer 146 are disposed with a gentle slope so that when the display device 100 is stretched, the stress generated in the lower connection lines 181*a* and 182*a* can be reduced. Further, the side surface of the planarization layer 146 has a relatively gentle slope so that the crack of the lower connection lines 181*a* and 182*a* or separation from the side surface of the planarization layer 146 can be suppressed.

Referring to FIGS. 2 to 4B, the lower connection lines 181*a* and 182*a* refer to wiring lines which electrically connect the pads on the plurality of lower plate patterns 121*a*. The lower connection lines 181*a* and 182*a* can be disposed on the plurality of lower line patterns 122*a*. Further, the lower line pattern 122*a* is not disposed in an area between the plurality of lower plate patterns 121*a* in which the lower connection lines 181*a* and 182*a* are not disposed.

The lower connection lines 181*a* and 182*a* include a first lower connection line 181*a* and a second lower connection line 182*a*. The first lower connection line 181*a* and the second lower connection line 182*a* are disposed between the plurality of lower plate patterns 121*a*. Specifically, the first lower connection line 181*a* refers to a wiring line extending in a first direction X between the plurality of lower plate patterns 121*a*, among the lower connection lines 181*a* and 182*a*. The second lower connection line 182*a* refers to a wiring line extending in a second direction Y between the plurality of lower plate patterns 121*a*, among the lower connection lines 181*a* and 182*a*.

The lower connection lines 181*a* and 182*a* can be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

In the case of a display panel of a general display device, various wiring lines such as a plurality of gate lines and a plurality of data lines extend between the plurality of sub pixels as a straight line and the plurality of sub pixels is connected to one signal line. Therefore, in the display panel of the general display device, various wiring lines, such as a gate line, a data line, a high potential voltage line, and a reference voltage line, extend from one side to the other side of the display panel of the organic light emitting display device without being disconnected on the substrate.

In contrast, in the display device 100 according to the exemplary embodiment of the present disclosure, various wiring lines, such as a gate line, a data line, a high potential voltage line, a reference voltage line, or an initialization voltage line having a straight line shape which are considered to be used for the display panel of the general display device, is disposed only on the plurality of lower plate patterns 121*a*. For example, in the display device 100 according to the exemplary embodiment of the present disclosure, a linear wiring line can be disposed only on the plurality of lower plate patterns 121*a*.

In the display device 100 according to the exemplary embodiment of the present disclosure, the pads on two adjacent lower plate patterns 121*a* can be connected by the lower connection lines 181*a* and 182*a*. Accordingly, the lower connection lines 181*a* and 182*a* electrically connect the gate pads, the data pads DP, or the voltage pad VP on two adjacent lower plate patterns 121*a*. Accordingly, the display device 100 according to the exemplary embodiment of the present disclosure can include a plurality of lower connection lines 181*a* and 182*a* which electrically connects various wiring lines, such as a gate line, a data line, a high potential voltage line, and a reference voltage line, between the plurality of lower plate patterns 121*a*. For example, the gate line can be disposed on the plurality of lower plate patterns 121*a* disposed to be adjacent to each other in the first direction X and the gate pad can be disposed on both ends of the gate line. In this case, the plurality of gate pads on the plurality of lower plate patterns 121*a* adjacent to each other in the first direction X can be connected to each other by the first lower connection line 181*a* which serves as a gate line. Therefore, the gate line disposed on the plurality of lower plate patterns 121*a* and the first lower connection line 181*a* disposed on the lower line pattern 122*a* can serve as one gate line. The above-described gate line can be referred to as a scan signal line. Further, wiring lines which extend in the first direction X, among all various wiring lines which can be included in the display device 100, such as an emission signal line and a high potential voltage line, can also be electrically connected by the first lower connection line 181a, as described above.

Referring to FIGS. 2 and 4B, the first lower connection lines 181a can connect the voltage pads VP on two lower plate patterns 121a which are disposed side by side, among the voltage pads VP on the plurality of lower plate patterns 121a disposed to be adjacent in the first direction X. The first lower connection line 181a serves as a scan signal line and an emission signal line which are gate lines, but is not limited thereto. The voltage pads VP on the plurality of lower plate patterns 121a disposed in the first direction X can be connected by the first lower connection line 181a serving as a high potential voltage line and transmit one high potential voltage.

Further, the second lower connection line 182a can connect the data pads DP on two lower plate patterns 121a which are disposed side by side, among the data pads DP on the plurality of lower plate patterns 121a disposed to be adjacent in the second direction Y The second lower connection line 182a can serve as a data line or a reference voltage line, but is not limited thereto. An internal line on the plurality of lower plate patterns 121a disposed in the second direction Y can be connected by the plurality of second lower connection lines 182a serving as data lines and transmit one data voltage.

As illustrated in FIGS. 4A and 4B, the first lower connection line 181a is disposed to be in contact with a top surface and a side surface of the planarization layer 146 disposed on the lower plate pattern 121a. The first lower connection line 181a can extend to the top surface of the lower line pattern 122a. Further, the second lower connection line 182a is disposed to be in contact with a top surface and a side surface of the planarization layer 146 disposed on the lower plate pattern 121a. The second lower connection line 182a can extend to the top surface of the lower line pattern 122a.

However, there is no need to dispose a rigid pattern in an area in which the first lower connection line 181a and the second lower connection line 182a are not disposed, so that the lower line pattern 122a which is a rigid pattern is not disposed below the first lower connection line 181a and the second lower connection line 182a.

In the meantime, referring to FIGS. 4A and 4B, a bank 147 is formed on the connection pad CNT, the lower connection lines 181a and 182a, and the planarization layer 146. The bank 147 is a component which divides adjacent sub pixels SPX. The bank 147 is disposed so as to cover at least a part of the connection pad CNT, the lower connection lines 181a and 182a, and the planarization layer 146. The bank 147 can be formed of an insulating material. Further, the bank 147 can include a black material. The bank 147 includes the black material to block wiring lines which can be visible through the active area AA. For example, the bank 147 can be formed of a transparent carbon based mixture and for example, include carbon black. However, it is not limited thereto and the bank 147 can be formed of a transparent insulating material. Even though in FIG. 1, it is illustrated that a height of the bank 147 is lower than a height of the light emitting diode 170, the present disclosure is not limited thereto and the height of the bank 147 can be equal to the height of the light emitting diode 170.

Referring to FIGS. 4A and 4B, the light emitting diode 170 is disposed on the first connection pad CNT1 and the second connection pad CNT2. The light emitting diode 170 can include an n-type layer 171, an active layer 172, a p-type layer 173, an n electrode 174, and a p electrode 175. The light emitting diode 170 of the display device 100 according to the exemplary embodiment of the present disclosure has a flip-chip structure in which the n-electrode 174 and the p-electrode 175 are formed on one surface.

The n-type layer 171 can be formed by injecting an n-type impurity into gallium nitride (GaN) having excellent crystallinity. The n-type layer 171 can be disposed on a separate base substrate which is formed of a material which is capable of emitting light.

The active layer 172 can be disposed on the n-type layer 171. The active layer 172 is a light emitting layer which emits light in the light emitting diode 170 and can be formed of a nitride semiconductor, for example, indium gallium nitride (InGaN). The p-type layer 173 can be disposed on the active layer 172. The p-type layer 173 can be formed by injecting a p-type impurity into gallium nitride (GaN).

The light emitting diode 170 according to the exemplary embodiment of the present disclosure can be manufactured by sequentially laminating the n-type layer 171, the active layer 172, and the p-type layer 173, and then etching a predetermined part to form the n-electrode 174 and the p-electrode 175. In this case, a predetermined part is a space for separating the n electrode 174 and the p electrode 175 from each other and the predetermined part can be etched to expose a part of the n-type layer 171. In other words, the surfaces of the light emitting diode 170 on which the n-electrode 174 and the p-electrode 175 are disposed are not flat surfaces, but have different heights.

As described above, the n-electrode 174 is disposed in the etched area and is formed of a conductive material. Further, the p-electrode 175 is disposed in an area which is not etched and is also formed of a conductive material. For example, the n-electrode 174 is disposed on the n-type layer 171 which is exposed by the etching process and the p-electrode 173 is disposed on the p-type layer 175. The p-electrode 175 can be formed of the same material as the n-electrode 174.

An adhesive layer AD is disposed on top surfaces of the first connection pad CNT1 and the second connection pad CNT2 and between the first connection pad CNT1 and the second connection pad CNT2 so that the light emitting diode 170 can be bonded onto the first connection pad CNT1 and the second connection pad CNT2. In this case, the n-electrode 174 can be disposed on the first connection pad CNT1 and the p-electrode 175 can be disposed on the second connection pad CNT2.

The adhesive layer AD can be a conductive adhesive layer in which conductive balls are dispersed in an insulating base member. Therefore, when heat or a pressure is applied to the adhesive layer AD, the conductive balls are electrically connected in a portion applied with the heat or pressure to have a conductive property and an area which is not pressurized can have an insulation property. For example, the n-electrode 174 is electrically connected to the first connection pad CNT1 by means of the adhesive layer AD and the p-electrode 175 is electrically connected to the second connection pad CNT2 by means of the adhesive layer AD. After applying the adhesive layer AD on the first connection pad CNT1 and the second connection pad CNT2 using an inkjet method, the light emitting diode 170 is transferred onto the adhesive layer AD and the light emitting diode 170 is pressurized and heated. By doing this, the second connection pad CNT2 is electrically connected to the p-electrode 175 and the first connection pad CNT1 is electrically connected to the n-electrode 174. However, the other part of the adhesive layer AD excluding a part of the adhesive layer AD disposed between the n-electrode 174 and the first connection pad CNT1 and a part of the adhesive layer AD disposed between the p-electrode 175 and the second connection pad CNT2 has an insulating property. In the meantime, the adhesive layer AD can be divided to be disposed on the first connection pad CNT1 and the second connection pad CNT2, respectively.

The first connection pad CNT1 is electrically connected to the plurality of lower conductive patterns DCP to be applied with a low potential voltage from the power supply PS to drive the light emitting diode 170.

The second connection pad CNT2 is electrically connected to the drain electrode 164 of the driving transistor 160 to be applied with a driving voltage from the driving transistor 160 to drive the light emitting diode 170. In the meantime, even though in FIGS. 4A and 4B, it is illustrated that the second connection pad CNT2 is not in direct contact with the drain electrode 164 of the driving transistor 160, but is in indirect contact therewith, the present disclosure is not limited thereto. Therefore, the second connection pad CNT2 and the drain electrode 164 of the driving transistor 160 can be in direct contact with each other.

Therefore, when the display device 100 is turned on, different voltage levels applied to the first connection pad CNT1 and the second connection pad CNT2 are transmitted to the n-electrode 174 and the p-electrode 175 so that the light emitting diode 170 emits light.

In the meantime, referring to FIG. 3, with respect to the upper substrate 112, a plurality of upper line patterns 122b can be disposed on the upper substrate 112. Referring to FIGS. 4A and 4B, with respect to the lower substrate 111, a plurality of upper line patterns 122b can be disposed below the upper substrate 112. For example, the plurality of upper line patterns 122b can be disposed to be in contact with the upper substrate 112.

Further, with respect to the upper substrate 112, the plurality of upper conductive patterns UCP can be disposed on the upper line pattern 122b. With respect to the lower substrate 111, the plurality of upper conductive patterns UCP can be disposed below the upper line pattern 122b.

The plurality of upper conductive patterns UCP includes a plurality of first upper conductive patterns UCP1 overlapping the plurality of lower conductive patterns DCP and a plurality of second upper conductive patterns UCP2 overlapping the plurality of pixels PX.

In other words, the plurality of upper conductive patterns UCP includes first upper conductive patterns UCP1 disposed in the first area A1 and a plurality of second upper conductive patterns UCP2 disposed in the second area A2.

The plurality of first upper conductive patterns UCP1 and the plurality of second upper conductive patterns UCP2 are connected to be applied with the same voltage. Specifically, a voltage which is different from the low potential voltage applied to the light emitting diode 170 can be applied to the plurality of first upper conductive patterns UCP1 and the plurality of second upper conductive patterns UCP2.

For example, when the low potential voltage is referred to as a first voltage, a second voltage can be applied to the plurality of upper conductive patterns UCP.

The second voltage can be various voltages, such as a gate voltage, a data voltage, a high potential voltage, a reference voltage, and an initialization voltage.

In the meantime, referring to FIGS. 2 and 3, the plurality of upper conductive patterns UCP and the plurality of lower conductive patterns DCP can have a shape which is stretchable to various directions.

Specifically, the plurality of upper conductive patterns UCP and the plurality of lower conductive patterns DCP can have a form in which the plurality of sub conductive patterns SCP is bonded at the center. Each of the plurality of sub conductive patterns SCP can have a wavy shape extending in a diagonal direction with respect to the first direction X and the second direction Y.

In other words, each of the plurality of lower conductive patterns DCP and the plurality of upper conductive patterns UCP can have a form in which a plurality of sub conductive patterns SCP disposed in point symmetry is connected.

For example, each of the plurality of sub conductive patterns SCP can have a sinusoidal shape. However, this is just illustrative, so that the shape of each of the plurality of sub conductive patterns SCP is not limited thereto. For example, each of the plurality of sub conductive patterns SCP can have a zigzag shape. As another example, each of the plurality of sub conductive patterns SCP can have various shapes, such as a plurality of rhombic substrates being connected and extending at vertices.

Each of the plurality of lower conductive patterns DCP and the plurality of upper conductive patterns UCP can be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti). However, it is not limited thereto. Further, the plurality of lower conductive patterns DCP and the plurality of upper conductive patterns UCP can be integrally formed.

Further, referring to FIGS. 4A and 4B, the filling layer 190 is disposed on the entire surface of the lower substrate 111 to be filled between the components disposed on the upper substrate 112 and the lower substrate 111. The filling layer 190 can be configured by a curable adhesive. Specifically, the material which configures the filling layer 190 is coated on the entire surface of the lower substrate 111 and then is cured so that the filling layer 190 can be disposed between the upper substrate 112 and the components disposed on the lower substrate 111. For example, the filling layer 190 can be an optically clear adhesive (OCA) and can be configured by an acrylic adhesive, a silicon based adhesive, and a urethane based adhesive.

In the meantime, referring to FIGS. 5A and 5B, in the first area A1, a first single layer 191a is disposed below each of the plurality of lower conductive patterns DCP and a second single layer 191b is disposed on each of the plurality of first conductive patterns UCP1.

In other words, the first single layer 191a is disposed between the lower substrate 111 and the plurality of lower conductive patterns DCP and the second single layer 191b is disposed between the upper substrate 112 and the plurality of upper conductive patterns UCP.

A thickness of the first single layer 191a can be larger than a thickness of the second single layer 191b. Comparing FIGS. 4A and 5A, when the display device is not stretched, a top surface of the first single layer 191a is higher than a top surface of the light emitting diode 170.

In some exemplary embodiments, only the first single layer 191a is disposed below the plurality of lower conductive patterns DCP and the second single layer 191b can be omitted.

The first single layer 191a and the second single layer 191b can be configured by an insulating material. For example, each of first single layer 191a and the second single layer 191b can be configured by a single layer or a double layer formed of at least one of silicon nitride (SiNx), silicon oxide (SiOx), and silicon oxynitride (SiON).

<Lighting Operation According to Stretching Operation>

Referring to FIGS. 4A and 5A, when the display device is not stretched or is stretched within an allowable range, the light emitting diode 170 and the plurality of second upper conductive patterns UCP2 are not in contact with each other. Further, the plurality of lower conductive patterns DCP and the plurality of first upper conductive patterns UCP1 are not in contact with each other.

For example, when the display device is not stretched or is stretched within an allowable range, the light emitting diode 170 and the plurality of second upper conductive patterns UCP2 are spaced apart from each other. Further, the plurality of lower conductive patterns DCP and the plurality of first upper conductive patterns UCP1 are spaced apart from each other.

Therefore, the plurality of light emitting diodes 170 is applied with a low potential voltage from the first connection pad CNT1 and is applied with a driving voltage from the second connection pad CNT2 so that the light emitting diode 170 normally emits light.

For example, when the display device is not stretched or is stretched within an allowable range, a normal image can be implemented.

In contrast, referring to FIGS. 4B and 5B, when the display device is excessively stretched beyond an allowable range, compression is caused in a vertical direction according to Poisson's Ratio. For instance, the display device can be said to be stretched excessively, if it is stretched to a set parameter or it is stretched beyond an allowable range. Therefore, even though the light emitting diode 170 and the plurality of second upper conductive patterns UCP2 are not in contact with each other, the plurality of lower conductive patterns DCP and the plurality of first upper conductive patterns UCP1 are in contact with each other to be electrically connected.

For example, when the display device is excessively stretched beyond the allowable range, the plurality of lower conductive patterns DCP and the plurality of first upper conductive patterns UCP1 are in contact with each other to be electrically connected.

However, as described above, a first voltage which is a driving voltage of the light emitting diode 170 is applied to the plurality of lower conductive patterns DCP and a second voltage which is different from the first direction is applied to the plurality of upper conductive patterns UCP.

However, when the display device is excessively stretched beyond an allowable range, the plurality of lower conductive patterns DCP and the plurality of first upper conductive patterns UCP1 can be conducted. Therefore, the first voltage which is applied to the first connection pad connected to the plurality of lower conductive patterns DCP can be changed.

For example, when the display device is excessively stretched beyond the allowable range, the first voltage applied to the first connection pad CNT2 is changed to a second voltage.

Therefore, a low potential voltage which is applied to the light emitting diode 170 can be changed so that the light emitting diode 170 may not be normally driven, or may not emit light. For example, when the display device is excessively stretched, the light emitting diode 170 does not emit light or erroneously operates.

Accordingly, the user can recognize that the display device is excessively stretched beyond the allowable range to stop stretching the display device and recover the display device to a non-stretched state.

Therefore, when the display device is recovered to or returned back to a non-stretched state, the plurality of lower conductive patterns DCP and the plurality of first upper conductive patterns UCP1 are spaced apart from each other. Therefore, the plurality of light emitting diodes 170 is applied with a low potential voltage from the first connection pad CNT1 so that the light emitting diode 170 normally emits light.

As a result, the display device according to the exemplary embodiment of the present disclosure is not excessively stretched beyond the allowable range so that the reliability for the repeated stretching of the display device can be ensured.

Further, the plurality of lower conductive patterns DCP which applies a low potential voltage is disposed in the first area A1 so that there is no need to apply a low potential voltage through the lower connection line.

Accordingly, a lower connection line for applying a low potential voltage, among the plurality of lower connection lines, is removed so that the number of the plurality of lower connection lines can be reduced.

Therefore, the plurality of lower connection lines is reduced so that a stretching resistance of the display device can be reduced or minimized. Accordingly, the stretchability of the display device according to the exemplary embodiment of the present disclosure can be improved.

The exemplary embodiments of the present disclosure can also be described as follows:

According to an aspect of the present disclosure, a display device includes a lower substrate which is stretchable and is divided into a first area, a second area, and a third area; a plurality of lower conductive patterns disposed on the first area of the lower substrate; a plurality of pixels which is disposed on the second area of the lower substrate; a plurality of lower connection lines which is disposed on the third area of the lower substrate and is connected to each of the plurality of pixels; an upper substrate which is opposite to the lower substrate and is stretchable; and a plurality of upper conductive patterns which is disposed below the upper substrate and is overlapped with the plurality of lower conductive patterns. By doing this, the excessive stretching of the display device can be suppressed.

The plurality of upper conductive patterns can include a plurality of first upper conductive patterns which is overlapped with the plurality of lower conductive patterns; and a plurality of second upper conductive patterns which is overlapped with the plurality of pixels.

Each of the plurality of pixels includes a light emitting diode and the plurality of lower conductive patterns can be electrically connected to the light emitting diode.

A first voltage which is a driving voltage of the light emitting diode can be applied to the plurality of lower conductive patterns and a second voltage which is different from the first voltage can be applied to the plurality of upper conductive patterns.

The display device can further comprise a first single layer disposed below each of the plurality of lower conductive patterns; and a second single layer disposed on each of the plurality of first upper conductive patterns.

A top surface of the first single layer can be higher than a top surface of the light emitting diode.

When the display device is excessively stretched, the plurality of lower conductive patterns and the plurality of first upper conductive patterns can be in contact with each other.

When the display device is excessively stretched, the plurality of pixels and the plurality of second upper conductive patterns can be spaced apart from each other.

When the display device is excessively stretched, the light emitting diode may not emit light or erroneously operates.

Each of the plurality of lower conductive patterns and the plurality of upper conductive patterns has a form in which a plurality of sub conductive patterns disposed in point symmetry is connected.

A plurality of lower plate patterns can be formed between the lower substrate and the plurality of pixels, a plurality of lower line patterns can be formed between the lower substrate and the plurality of lower connection lines, and a modulus of elasticity of each of the plurality of lower plate patterns and the plurality of lower line patterns can be higher than a modulus of elasticity of the lower substrate.

A plurality of lower line patterns can be formed between the lower substrate and the first single layer, and a modulus of elasticity of each of the plurality of lower line patterns can be higher than a modulus of elasticity of the lower substrate.

A plurality of upper line patterns can be formed between the upper substrate and the plurality of upper conductive patterns, and a modulus of elasticity of each of the plurality of upper line patterns can be higher than a modulus of elasticity of the upper substrate.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

What is claimed is:

1. A display device, comprising:
a lower substrate configured to be stretchable and divided into a first area, a second area, and a third area;
a plurality of lower conductive patterns disposed on the first area of the lower substrate;
a plurality of pixels disposed on the second area of the lower substrate;
a plurality of lower connection lines disposed on the third area of the lower substrate and connected to at least one the plurality of pixels respectively;
an upper substrate disposed opposite to the lower substrate and configured to be stretchable; and
a plurality of upper conductive patterns disposed below the upper substrate and overlapped with the plurality of lower conductive patterns respectively,
wherein the plurality of upper conductive patterns is disposed on the plurality of lower conductive patterns.

2. The display device according to claim 1,
wherein the plurality of upper conductive patterns includes:
a plurality of first upper conductive patterns overlapped with the plurality of lower conductive patterns; and a plurality of second upper conductive patterns overlapped with the plurality of pixels.

3. The display device according to claim 2,
wherein one of the plurality of pixels includes a light emitting diode and the plurality of lower conductive patterns is electrically connected to the light emitting diode.

4. The display device according to claim 3,
wherein a first voltage which is a driving voltage of the light emitting diode is applied to the plurality of lower conductive patterns, and a second voltage which is different from the first voltage is applied to the plurality of upper conductive patterns.

5. The display device according to claim 3, further comprising:
a first single layer disposed below each of the plurality of lower conductive patterns; and
a second single layer disposed on each of the plurality of first upper conductive patterns.

6. The display device according to claim 5,
wherein a top surface of the first single layer is disposed higher than a top surface of the light emitting diode.

7. The display device according to claim 5,
wherein a plurality of lower line patterns is disposed between the lower substrate and the first single layer, and a modulus of elasticity of each of the plurality of lower line patterns is higher than a modulus of elasticity of the lower substrate.

8. The display device according to claim 3,
wherein when the display device is stretched beyond an allowable range, the plurality of lower conductive patterns and the plurality of first upper conductive patterns are in contact with each other.

9. The display device according to claim 3,
wherein when the display device is stretched beyond an allowable range, the plurality of pixels and the plurality of second upper conductive patterns are spaced apart from each other.

10. The display device according to claim 3,
wherein when the display device is stretched beyond an allowable range, the light emitting diode does not emit light or erroneously operates.

11. The display device according to claim 3,
wherein each of the plurality of lower conductive patterns and the plurality of upper conductive patterns has a form in which a plurality of sub conductive patterns disposed in point symmetry is connected.

12. The display device according to claim 1,
wherein a plurality of lower plate patterns is disposed between the lower substrate and the plurality of pixels, a plurality of lower line patterns is disposed between the lower substrate and the plurality of lower connection lines, and a modulus of elasticity of each of the plurality of lower plate patterns and the plurality of lower line patterns is higher than a modulus of elasticity of the lower substrate.

13. The display device according to claim 1,
wherein a plurality of upper line patterns is disposed between the upper substrate and the plurality of upper conductive patterns, and a modulus of elasticity of each of the plurality of upper line patterns is higher than a modulus of elasticity of the upper substrate.

* * * * *